United States Patent [19]
Hollmann et al.

[11] Patent Number: 5,737,252
[45] Date of Patent: Apr. 7, 1998

[54] CIRCUIT ARRANGEMENT COMPRISING A PERMUTATION UNIT AND METHOD OF PROCESSING A BATCH OF ITEMS

[75] Inventors: Hendrik D.L. Hollmann; Constant P.M.J. Baggen, both of Eindhoven, Netherlands

[73] Assignee: U.S. Phillips Corporation, N.Y., N.Y.

[21] Appl. No.: 595,089

[22] Filed: Feb. 1, 1996

[30] Foreign Application Priority Data

| Feb. 1, 1995 | [EP] | European Pat. Off. | 95200242 |
| Mar. 3, 1995 | [EP] | European Pat. Off. | 95200520 |
| Mar. 9, 1995 | [EP] | European Pat. Off. | 95200580 |
| Mar. 16, 1995 | [EP] | European Pat. Off. | 95200642 |

[51] Int. Cl.$^6$ .................. G06F 1/02; G06F 12/00
[52] U.S. Cl. ........................ 364/717.05; 395/484
[58] Field of Search ................. 364/717, 717.15, 364/718; 395/454, 484; 380/46; 371/2.1, 2.2

[56] References Cited

U.S. PATENT DOCUMENTS

| 4,547,887 | 10/1985 | Mui | 375/1 |
| 5,133,061 | 7/1992 | Melton et al. | 395/455 |
| 5,297,207 | 3/1994 | Degele | 380/46 |
| 5,483,541 | 1/1996 | Linsky | 371/2.1 |

FOREIGN PATENT DOCUMENTS

0406017A1  1/1991  European Pat. Off. ........ H04N 7/167

*Primary Examiner*—Chuong Dinh Ngo

[57] ABSTRACT

A circuit arrangement calculates pseudo-random permutations of a set of numbers. Including compositions of some basic pseudo-random permutations and the inverse permutations of permutations that are calculated. The basic pseudo-random permutations, their compositions and inverses are all calculated by the same generator whose operation is commanded to calculate the appropriate permutation by specifying a set of integer coefficients $f_i$. The generator calculates the permutations $\sigma(n)$ of the numbers $n=0 \ldots m-1$ corresponding to $$\sigma(n) = f_0 + \sum_{i=1}^{s} f_i \binom{n}{i} \alpha^{i-1} \bmod m$$

where $\alpha$ is an integer number which is divisible by all prime factors of m and by four if m is divisible by four, with a potency $s(\alpha)$ of two or higher. When the same $\alpha$ is used for all permutations it is assured that all compositions and inverses of the generated permutations can be calculated in the same way, by the same generator. By storing a batch of items in a storage medium in a first order and retrieving the items from the storage medium in a second order, the first and second order corresponding to different permutations which are both of this type, it is made possible to permute the batch pseudo randomly and start storing the batch of items in the storage medium before a previous batch has been fully retrieved from it.

16 Claims, 2 Drawing Sheets

CIRCUIT ARRANGEMENT COMPRISING A PERMUTATION UNIT AND METHOD OF PROCESSING A BATCH OF ITEMS

TECHNICAL FIELD

The invention relates to a circuit arrangement which generates successive pseudo random permutations of a set of "m" numbers.

BACKGROUND OF THE INVENTION

Pseudo-random permutations have various purposes. They can be used for interleaving purposes in combination with an error correcting code to change the order in which symbols from the code are processed, which can make the error protection process more robust against systematic errors. They can also be used in random generators, e.g., for generating test signals.

Often, it is desirable to generate successively several different pseudo random permutations that are different compositions of the same basic pseudo random permutation or permutations as well as inverse permutations. A composition corresponds to cumulatively repeated reordering of the numbers. An inverse permutation is a permutation that undoes the permutation.

For example if one wants to permute a set of items one may write the items into a storage medium in one order of storage locations, and retrieve them from the storage medium in a different order of storage locations. To save storage space when successive sets of items have to be permuted, one would like to store the items of a set each time at storage locations in the order that they are vacated by retrieving the items of a previous set, before the previous set has been entirely read. When each set has to be permuted by the same pseudo-random permutation, this means that the order of storage locations for storing each successive set has to be a composition of the pseudo random permutation applied to the order of storage locations of the previous set.

The circuit arrangement has to generate these successive pseudo random permutations. However, it may require very complex and time consuming operations to generate all the required pseudo random permutations. Even when one uses basic pseudo random permutations that are fairly simple to generate, the need to generate compositions of such basic pseudo random permutations may mean that the computation of different pseudo random permutations will differ widely in complexity and will prove very costly in terms of computation time and/or required hardware.

SUMMARY OF THE INVENTION

Amongst others, it is an object of the invention to provide for a circuit arrangement that is able to generate pseudo random permutations that are compositions of the same basic pseudo random permutation or permutations, which circuit arrangement is able to generate each of these pseudo random permutations with the same calculation circuits used to execute the same series of computation steps and wherein the required calculation circuits are simple in structure.

It is another object of the invention to provide for a method of processing items, wherein the order according to which the items are processed is a pseudo random permutation of the order of receiving the items, the permutation being achieved by storage and retrieval of the items from a storage medium and wherein the required mount of storage medium is reduced.

The circuit arrangement according to the invention is characterized, in that the circuit arrangement includes control means for generating control signals, each control signal specifying a respective set of "s+1" integer coefficients "$f_i$", i=0 ... s, "s" being a natural number greater than one; and computing means operating in repeated cycles, each cycle under control of a respective one of the control signals, for computing in that cycle a respective one of the successive permutations corresponding to $$\sigma(n) = f_0 + \sum_{i=1}^{s} f_i \binom{n}{i} \alpha^{i-1} \bmod m$$

in which the $f_i$ are the integer coefficients from the set specified by the respective one of the control signals, and $\alpha$ is an integer number common to all cycles, $\alpha$ being divisible by all prime factors of m, $\alpha$ having a potency $s(\alpha)$ equal to "s" with respect to m.

The potency $s(\alpha)$ of a number $\alpha$ with respect to m is the smallest natural number s for which $$\alpha^s = 0 \bmod m,$$

i.e., the $s^{th}$ power of $\alpha$ is divisible by m.

The invention is based on the realization that permutations $\sigma(n)$ generated according to the invention form a group, in the mathematical sense of the word "group". This means that if certain basic pseudo random permutations can be calculated in this way, each by specifying a set of integer coefficients $f_i$, then also all compositions of these basic pseudo random permutations and even their inverse permutations can be calculated in this way, each merely by specifying its own, different set of integer coefficients $f_i$.

The invention uses this realization by providing calculating means that calculate the permutations in correspondence with the given formula and that are reused to calculate other permutations, each time under control of the specification of another set of coefficients $f_i$. Thus, a range of permutations, their compositions and their inverses can be calculate successively by the same calculating means.

In an embodiment of the circuit arrangement according to the invention at least one of the control signals specifies a set of s+1 integer coefficients such that a resulting permutation corresponds to a composition of at least two permutations from among the successive permutations.

In an embodiment of the circuit arrangement according to the invention the potency s is two. In this way the complexity of the calculating means can be minimized, while still generating reasonably pseudo-random permutations. Higher potencies, for example 3 or higher, however, may be preferable because of considerations relating to better random properties.

In an embodiment of the circuit arrangement according to the invention, in at least one of the respective sets of integer coefficients all $f_i$, with the exception of $f_0$, are equal to each other, and have a largest common denominator of 1 with m. This provides for a basic permutation which is particularly easy to select ($f_0$ is arbitrary). More permutations can be obtained which correspond to compositions of the permutation generated in this way with itself ($\sigma(\sigma(n))$, $\sigma(\sigma(\sigma(n)))$ etc.), or the inverse of this permutation. In general, the permutations obtained in this way will not be specified by such a simple set of coefficients $f_i$. Therefore, other permutations specified with coefficients $f'_i$ that are not equal will be used in conjunction with this at least one respective set of permutations.

In an embodiment of the circuit arrangement according to the invention the calculating means are arranged for computing successive permuted numbers in each cycle in n successive steps, n=0 . . . m−1, from intermediate variables $u^{(i)}$, i=0 . . .s. Intermediate variable $u^{(0)}$ is initialized to $f_0$ in an initial step at a beginning of each cycle and intermediate variables $u^{(i)}$, i=1 . . .p 1, are initialized to $f_i\alpha^{i-1}$ in the initial step a. The value of each of the intermediate variables $u^{(i)}$, except $u^{(s)}$, is replaced, in each successive step, by a respective modulo sum $u^{(i)}+u^{(i+1)}$ mod m using the values of the intermediate variables in the preceding step, and the values of the intermediate variable $u^{(0)}$ in each of the successive steps are $u^{(i)}$ and $u^{(i+1)}$ which are determined as the permuted numbers σ(n). In this way, the permutation is calculated without requiring multiplications for the calculation of the successive permutated values σ(n). As circuits that perform multiplications are complex or slow, this makes the calculation of the permutation simpler and faster.

A further embodiment of the circuit arrangement according to the invention includes a cascade of s recursion units, each having a respective memory element and a respective modulo adder. The respective modulo adder of a front end recursion unit in the cascade has a first summand input coupled to the respective memory element of the front end recursion unit and to a further memory element. The respective modulo adder of each particular recursion unit, except the front end recursion unit, has a first summand input coupled to the memory element of the particular recursion unit and a second summand input coupled to the memory element of the recursion unit that precedes the particular recursion unit in the cascade. A sum output of the respective modulo adder in each recursion unit is coupled to an input of the respective memory element of that recursion unit. The calculating means is arranged to initialize the content of the memory element in a final recursion unit in the cascade at the beginning of each cycle to $f_0$ and the contents of the memory units in each of the recursion units that successively precede the final recursion unit in the cascade to $f_i\alpha^{i-1}$, i=1 . . .s−1, respectively. The further memory element is initialized to $f_s\alpha^{s-1}$. the respective memory elements of each of the recursion units is loaded with the output of that recursion unit's respective modulo adder in each of successive steps n=1 . . .m. the contents of the memory element memory unit of the final recursion unit is supplied as an output and is used as the random number σ(n) in the successive steps.

The invention is particularly useful for pseudo-random permutation of a set of data-items by writing the data-items into a memory in one order and subsequently reading them from the memory in another order. When several sets have to be permuted in this way, the data-items from one set are replaced in memory by a new set of data-items as the one set is being read. In this case it becomes necessary to generate addresses for the memory each time by generating the composition of basic permutations. The calculating means are very suitable for this purpose: Therefore, in an embodiment of the circuit arrangement according to the invention includes
- a memory, the numbers from the set of "m" numbers corresponding to addresses referring to respective locations in the memory; and
- a read/write unit, for writing a respective set of data items into the memory in each particular cycle, and reading that respective set of clam items from the memory in a subsequent one of the cycles succeeding the particular cycle, each respective set of data items being written in an order of addresses corresponding to the permutation generated for its particular cycle and read in an order of addresses corresponding to the permutation generated for the subsequent cycle.

In an embodiment of the circuit arrangement according to the invention the sets of integer coefficients $f_i$ are selected such that a composition of an inverse of the permutation calculated for the particular cycle with the permutation calculated for the subsequent cycle is equal to a common permutation independent of the particular cycle. In this way the data-items in each set are permuted by the same pseudo-random .permutation.

Pseudo random permutation of data-items is particularly useful if used in combination with an error protecting code. This allows the data items to be transmitted or stored and later to be received or retrieved with robustness against errors.

The invention also provides for a method of processing a batch of m items, method which is achieved by:
receiving the batch, each item in the batch being received in association with a first own rank number in the batch;
assigning a respective location in a storage medium to each particular item, according to a first function of the first own rank number of the particular item;
storing each particular item in the storage medium at the respective location assigned to it;
assigning a second own rank number to each storage location, according to a second function of the storage location;
retrieving the items from the storage medium; and
processing the particular item retrieved from a particular storage location according to the second own rank number of that particular location, wherein the first function and the second function are computed in correspondence with $$\text{location}(n1) = f_0 + \sum_{i=1}^{s} f_i \binom{n1}{i} \alpha^{i-1} \bmod m$$

$$\text{ranknumber}(n2) = g_0 + \sum_{i=1}^{s} g_i \binom{n2}{i} \alpha^{i-1} \bmod m$$

respectively, n1 being the rank number, n2 being a location number of the storage location in an order of storage locations, the $f_i$ and $g_i$ i=0 . . . s being integer coefficients from respective sets, each of s+1 integers, and α being an integer number, divisible by all prime factors of m, α having a potency equal to "s" with respect to m. According to this method the order of items is permuted by the use of a storage medium, the items being treated according to their location in the storage medium. Different permutations, their compositions and their inverses can be easily realized by storing and retrieving respectively according to two different permutations which both satisfy the formula for the same α. The items can be for example data-items, but they could also be other physical items such as products under manufacture, when one wants to eliminate systematic manufacturing effects. For example, one might want to prevent a product from one source to be combined systematically with one of the available assembly stations.

BRIEF DESCRIPTION OF THE DRAWING

In the drawing:

FIG. 1 shows a permutation unit for a circuit arrangement in accordance with the invention. The permutation unit comprises an input 1 and an output 2, both of which are coupled to read/write means 3. The read/write means 3 are coupled to a memory 5. The permutation unit also comprises an address generator 7 which is coupled to an address input of the memory 5.

Figure 1:
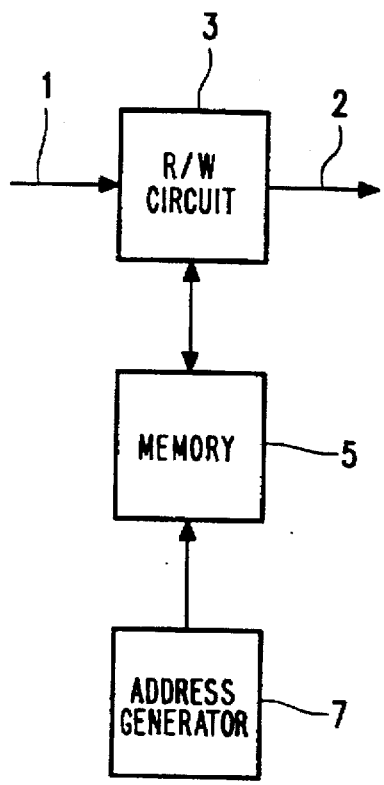
FIG. 1 shows a permutation unit.

The permutation unit operates under the control of a clock (not shown). In each clock cycle the read/write means 3 read a data item from the memory 5, i.e., from a location having an address generated for the relevant cycle by the address generator 7. Subsequently, the read/write means 3 write a data item received on the input 1 for the relevant cycle in this location.

During successive clock cycles this is repeated with other addresses for the memory 5. Thus, a respective data item is read successively from each location of the memory 5 and applied to the output 2. These data items together constitute a block of data items on the output 2. Furthermore, each of the data items in a block received on the input is thus written into a respective location of the memory.

This is repeated for successive blocks the address generator 7 generating all addresses of the memory. Thus, each block is successively written into and read from the memory again. The address generator generates these addresses for each block in an own sequence. As a result, the data items of each block are read in a sequence which deviates from the sequence in which they have been written.

The permutation unit is used, for example as an interleaver or a de-interleaver in a transmission system utilizing an error protecting code.

Figure 2:
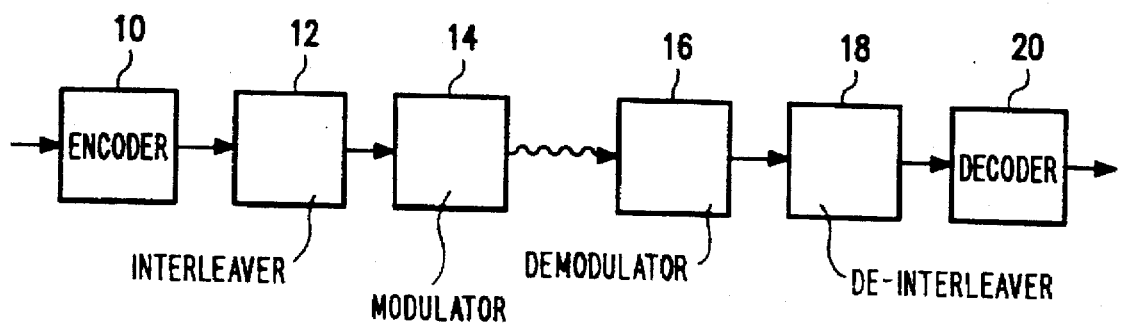
FIG. 2 shows a transmission system.

FIG. 2 shows such a transmission system. This system comprises a cascade connection of an encoder 10, an interleaver 12, a modulator 14, a transmission channel, a demodulator 16, a de-interleaver 18 and a decoder 20.

Data are applied to an input of the encoder 10 during operation. The encoder encodes these data in an error correcting code. Any known error correcting code, for example a convolution code or a turbo code, can be used for this purpose. The encoded data are divided into blocks, each of which contains a logic succession of symbols.

The decoder 20 corresponds to the encoder and corrects symbol errors incurred during transmission from the encoder 10 to the decoder 20. The error correcting code is such that symbol errors which occur distributed across the logic succession can be suitably corrected. Burst errors, i.e., errors where a number of successive symbols in the logic succession are incorrect, are less readily correctable.

The modulator 14 produces a signal with a number of frequency channels which are simultaneously transmitted. The symbols of each block are subdivided into a number of groups. Each group corresponds to a frequency channel and the information of the symbols in a group is transmitted in the corresponding frequency channel. This can be realised, for example by interpreting the symbols of each group as a number, by arranging these numbers in a series and by forming an (FFT) Fast Fourier Transform of this series. The result of this FFT is subsequently transmitted via the transmission channel, for example a wireless terrestrial broadcast channel. FFT and transmission are repeated for successive blocks. This corresponds to the (OFDM) Orthogonal Frequency Division Multiplexing technique which is well known in the art.

The demodulator 16 corresponds to the modulator 14. The demodulator receives the various frequency channels simultaneously and reconstructs the groups of symbols, each of which is transmitted in a respective frequency channel. According to the OFDM technique, this is realised, for example by forming an inverse FFT of the signal received and by reconstructing the numbers and hence the groups therefrom.

The interleaver 12 serves to ensure that symbols which directly succeed one another in the logic succession are almost always modulated in different frequency channels. The spacing between these channels (in terms of channels with intermediate frequencies) is preferably even larger than zero, so that adjacent symbols enter non-neighbouring channels. This serves to ensure that disruption of a single channel, or of a number of neighbouring channels, does not cause burst errors in the logic succession.

The de-interleaver 18 corresponds to the interleaver 12 and performs the inverse operation, so that the logic succession is reconstructed in respect of order (except for symbol errors) before being applied to the decoder 20.

The interleaver 12 positions each pair of symbols which adjoin one another in the logic succession at a respective distance of a number of channels from one another. These respective distances have different values and it is ensured that different distances occur approximately equally often. As a result, the system can withstand disruptions of the transmission channel leading to poor reception in a periodic system of frequency channels. A periodic system is to be understood to mean herein a system in which the poor reception repeats itself, as a function of the frequency, each time after the same number of channels.

Every other pair of symbols which are so near to one another that a simultaneous error in the symbols of such a pair could cause burst correction problems, is also positioned at a respective distance of a number of channels from one another. These respective distances preferably also have different values and it is ensured that these different distances also occur almost equally often.

The transmission system is shown by way of example. Without deviating from the invention other channel modulation techniques could be used.

The permutation group $\Lambda_\alpha$

The respective sequences in which the addresses of the memory 5 are generated for each block by the address generator 7 determine how the data items of each block are permuted. The invention utilizes addresses $\sigma(i)$ in a sequence $(\sigma(0), \sigma(1), \ldots \sigma(m-1))$ (where m is the number of data items in a block and the $\sigma(i)$ are mutually different for different i). Such a sequence will be referred to as a permutation and denoted by the reference $\sigma$. The invention utilizes notably permutations a forming part of sets $\Lambda_\alpha$ defined in conformity with $$\Lambda_\alpha = \left\{ (\sigma(0), \sigma(1), \ldots \sigma(m-1)) | \sigma(n) = f_0 + \sum_{i=1}^{s} f_i \binom{n}{i} \alpha^{i-1} \bmod m \right\}$$

with the binomial coefficient $$\binom{n}{i} = \frac{n(n-1)\ldots(n-i+1)}{i!}$$

Therein, $\alpha$ is a number chosen so that it is divisible by any prime factor of m, and also divisible by 4 if m is divisible by 4. For example, if m is 100 (prime factors 2 and 5), $\alpha$ can thus be an arbitrary multiple of 20. "s" is the "potency" of $\alpha$, i.e. the smallest natural number for which $$\alpha^s = 0 \bmod m$$

Thus, in the above example if $\alpha=20$ s is 2, because $\alpha^2=400$ is divisible by m=100. An $\alpha$ which contains all prime factors of "m" only once has maximal possible potency s. Its potency is equal to the power of the prime factor of m which has the highest power in m. So for example when m=45=3*3*5, α=15=3*5 has the highest potency s=2, because the prime factor 3 has the highest power (2) in m. To obtain an α with potency of at least 2, m should therefore be divisible by the square of at least one prime: m values that are prime do not allow a potency of 2 or higher nor do products of different primes. Thus, for example, m cannot be equal to 1, 2, 3, 5, 6=2*3, 7, 10=2*5 etc. if an α with a potency of 2 is required. 4 also does not allow an α with a potency of 2.

To enable an ample choice of α values with potency s greater than 1, m should therefore be reasonably large, and contain many different prime factors. All α values with finite potency will be integer multiples of a basic α value. This basic α value is the product of all prime factors of m and has the highest possible potency.

The numbers $f_i$ are natural numbers chosen so that the σ(i) permutations from the set $\Lambda_\alpha$ pass through the numbers 0 to m−1 (for example, $f_i$=1 for all i>0, or $f_i$ independent of i when i>0 and prime with m, which means that the largest common denominator of $f_i$ and m is 1; when $f_0$=0 this corresponds to a permutation as can be obtained from a linear congruential algorithm).

Within the set $\Lambda_\alpha$ the σ(n) polynomials are dependent on their position n in the sequence. The degree of this polynomial is at the most s within $\Lambda_\alpha$. For pseudo-random permutations s is preferably 2 or higher. The random properties can be optimized by generating different permutations and choosing the best one.

A product of elements of the set $\Lambda_\alpha$ will now be defined: the product σ∘π is the composition of the permutations σ and π, which means that $$(\sigma \circ \sigma)(n) = \sigma(\pi(n))$$

It can be demonstrated that the set $\Lambda_\alpha$ with this product constitutes a group (in the mathematical sense of the word "group"). This means that $\Lambda_\alpha$ contains the identity permutation ($f_0$=0, $f_1$=1 and all other $f_i$=0), that the composition of two permutations from $\Lambda_\alpha$ belongs to $\Lambda_\alpha$ again, and that for each permutation from $\Lambda_\alpha$ the inverse permutation also belongs to $\Lambda_\alpha$. (This also holds for $\Lambda_\alpha$ in which α is not divisible by 4 if m is divisible by 4, and also if $\Lambda_\alpha$ is not limited to permutations).

The calculation of the numbers $f_i$ describing the product a σ∘π is in principle a matter of substitution. Let σ and π be described by numbers $g_i$ and $h_i$, respectively:

$$\sigma(n) = g_0 + \sum_{i=1}^{s} g_i \binom{n}{i} \alpha^{i-1} \bmod m$$

$$\pi(n) = h_0 + \sum_{i=1}^{s} h_i \binom{n}{i} \alpha^{i-1} \bmod m$$

The product can then be calculated by substituting π(n) in the expression for σ:

$$(\sigma \circ \pi)(n) = g_0 + \sum_{i=1}^{s} g_i \binom{\pi(n)}{i} \alpha^{i-1} \bmod m$$

An explicit expression is obtained for σ∘π by working out the binomial coefficient. The group property of $\Lambda_\alpha$ ensures that this explicit expression can be reconfigured to $$(\sigma \circ \pi)(n) = f_0 + \sum_{i=1}^{s} f_i \binom{n}{i} \alpha^{i-1} \bmod m$$

with $f_i$ natural numbers. These numbers can be calculated from the explicit expression, for example by utilizing differentials. A differential Δπ(n) of a function π of n (such as a permutation) is defined by Δπ(n)=π(n+1)-π(n). Repeated application to a permutation from $\Lambda_\alpha$ produces:

$$[\Delta^i \pi(n)]_{n=0} = h_i \alpha^{i-1}$$

and it also holds that π(0)=$h_0$. Analogously, for the product σ∘π it holds that $$[\Delta^i (\sigma \circ \pi)(n)]_{n=0} = f_i \alpha^{i-1}$$

and σ∘π(0)=$f_0$. When applied to the explicit expression for σ∘π, this produces the numbers $f_i$. So in the example where m=100 and α=20, when σ(n) is specified by $g_0$=$g_1$=$g_2$=1, it follows that σ(0)=1, σ(1)=2, σ(2)=23 . . . σ(23)=84, and from that it follows that σ(σ(0))=2, σ(σ(1))=23 and σ(σ(0))=84. From this, it follows that the composition σ(σ(n)) is specified by $f_0$=2, $f_1$=21, $f_2$=2. Similarly it can be compared that σ(σ(σ(n))) is specified by $f_0$=23, $f_1$=61, $f_2$=3.

The numbers $h_i$, describing an inverse π of a permutation σ, are obtained, for example by solution from the expression for the $f_i$ for the product σ∘π=e. Alternatively, $\sigma_n = \sigma \sigma_{n-1}$, where $\sigma_1 = \sigma$, is calculated for successive n until $\sigma_n$ is the identity permutation (the group character ensures that this is possible); $\sigma_{n-1}$ is then the inverse of σ.

Starting from the numbers $f_i$, permutations from $\Lambda_\alpha$ can be simply generated by means of a recursive generator.

Figure 3:
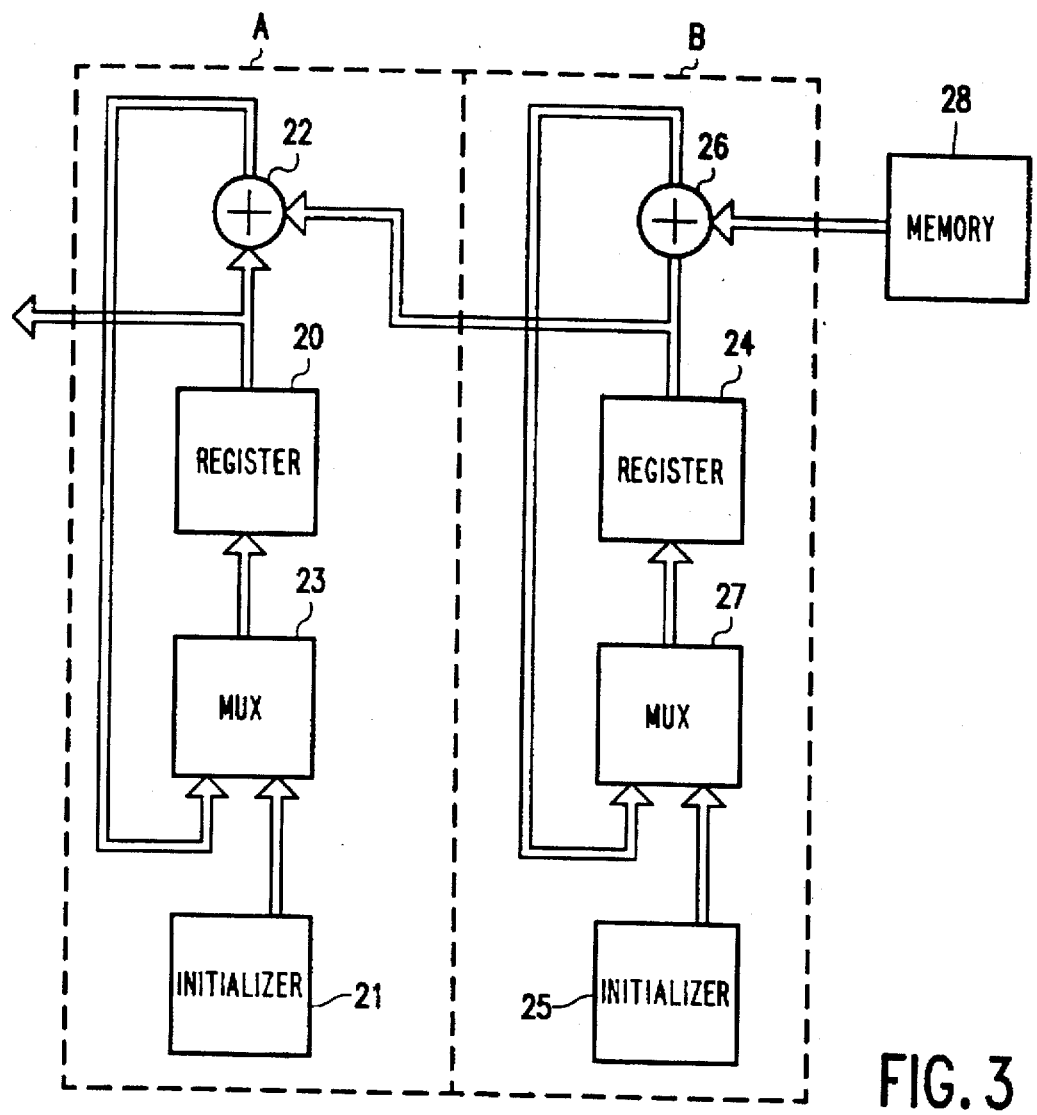
FIG. 3 shows an address generator.

FIG. 3 shows a recursive address generator which generates a permutation from $\Lambda_\alpha$ for the case where α has a potency s=2. As is denoted by dashed lines, this address generator comprises two sections A and B. The section A comprises a first register 20, a first adder 22, a first initializer 21, and a first multiplexer 23. The output of the first register 20 constitutes the output of the address generator. This output is coupled to an input of the first adder 22. An output of the first adder 22 and the first initializer 21 are coupled to an input of the first register 20 via the first multiplexer 23.

The section B comprises a second register 24, a second adder 26, a second initializer 25, and a second multiplexer 27. The output of the second register 24 is coupled to a further input of the first adder 22 and alto to an input of the second adder 26. The second adder 26 also receives an input signal from a memory 28. An output of the second adder 26 and the second initializer 25 are coupled to an input of the second register 24 via the second multiplexer 27.

Figure 4:
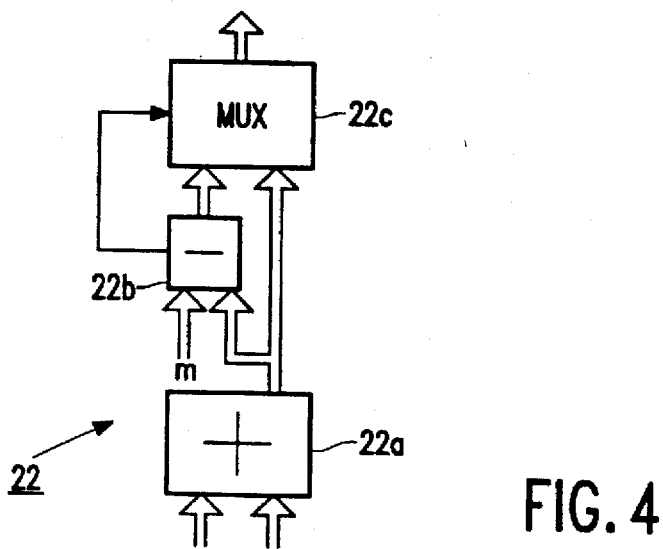
FIG. 4 shows a modulo adder.

FIG. 4 shows an embodiment of a modulo adder. The adders 22, 26 are constructed as modulo adders. FIG. 4 shows a binary adder 22a, a subtracter 22b and a multiplexer 22c. The inputs of the modulo adder 22 constitute the inputs of the binary adder 22a. The output of the binary adder 22a is coupled to the subtracter 22b and the multiplexer 22c. The output of the subtracter 22b is also coupled to the multiplexer 22c. A borrow output of the subtracter 22b is coupled to the control input of the multiplexer 22c. The output of the multiplexer constitutes the output of the modulo adder 22.

The binary adder 22a calculates the sum of the input signals during operation. The subtracter 22b subtracts "m" from this sum. If the subtraction result is smaller than zero, the multiplexer 22c just transmits the sum. If the subtraction result is larger than zero, the subtracter transmits the result instead of the sum.

The address generator of FIG. 3 operates in synchronism with a data item clock (not shown); this clock outputs a pulse whenever a data item has been read and written. The contents of the registers 20, 24 are refreshed in response to this pulse. When the contents of the registers 20 and 24 are referred to as $u_n$ and $v_n$ at the time of processing of the $n^{th}$ data item in a block, the following holds $$u_{n+1} = u_n + v_n \bmod m$$

$$v_{n+1} = v_n + d \bmod m$$

For n=0 the contents of the registers 20, 24 are initialized by the initializers 21, 25.

When the first and second registers 20, 24 are then initialized to $f_0$ and $f_1$ and the memory presents $f_2 \alpha$ to the second adder, the address generator will generate the series $$u(n) = f_0 + \sum_{i=1}^{s} f_i \binom{n}{i} \alpha^{i-1} \bmod m$$

When use is made of a values of higher potency, a plurality of sections such as section B are arranged in cascade between the sections A and B. The registers in these various sections, numbered i=1 ... s−1 in the order in which the sections occur in cascade from A to B (inclusive), are then initialized to the values $f_i \alpha^{i-1}$.

Another differential technique which can be used for generating permutations from $\Lambda_\alpha$ utilizes a modified differential $\Delta_\lambda$ which is defined as $$\Delta_\lambda \sigma(n) = \sigma(n+1) - (1+\alpha \lambda) \sigma(n)$$

If $\sigma(n+1)$ is to be calculated by means of expressions for $\Delta_\lambda \sigma(n)$, multiplication will be necessary. When $\lambda$ is suitably chosen, however, the number of recursion sections required for this calculation can be limited.

Applications of the permutation group $\Lambda_\alpha$

The group character of $\Lambda_\alpha$ ensures that upon composition of permutations the resultant permutation can again be written in the simple form of a permutation from $\Lambda_\alpha$. The invention utilizes this aspect to construct simple permutation units for the execution of pseudo-random permutations.

A first application concerns a permutation unit intended to execute the same permutation $\pi(n)$ on each block. This permutation unit writes the data items of a given block in conformity with a series of addresses $\sigma_j(n)$ (i.e. in the sequence in which the data items of the preceding block have been read). The permutation unit subsequently reads the data items in conformity with a series of addresses $\sigma_{j+1}(n)$. The data item written as the $n^{th}$ data item must then be read as the $\pi(n)^{th}$ data item. This is the case if $$\sigma_{j+1}(n) = \pi(\sigma_j(n))$$

so if $\sigma_{j+1} = \pi \circ \sigma_j$. Upon permutation of suasive blocks, this is repeated each time for increasing j. When permutations $\pi$ and $\sigma_j$ from $\Lambda_\alpha$ are used, $\sigma_{j+1}$ will always also belong to $\Lambda_\alpha$. As a result, all $\sigma_j$ can be simply generated. To this end use can be made of, for example the address generator shown in FIG. 3, or alternatively the explicit expression for the elements of permutations from $\Lambda_\alpha$.

A second application concerns the execution of different permutations $\pi_j(n)$, $\pi_{j+1}(n)$ for successive blocks. It then holds that $\sigma_{j+1}(n) = \pi_j(\sigma_j(n))$. If the permutations $\pi_j(n)$, $\pi_{j+1}(n)$ are both chosen from the same set $\Lambda_\alpha$, the series $\sigma_j$ will again be permutations from $\Lambda_\alpha$ which can be simply generated.

Conversely, if the permutations $\sigma_j, j=1,\ldots$ are all chosen as member of one set $\Lambda$, it is ensured that the permutations $\pi_j$ for successive blocks j and their inverse permutations are members of that $\Lambda$ and can be simply generated. This can be applied for example when it is necessary to signal for each data item "n" transmitted from the output 2 how it has been permuted, i.e. to signal its position $\pi_j^{-1}(n)$ in the block j when this data-item was received at the input 1. Using the fact that $\pi_j^{-1}(n)$ is a member of $\Lambda$ it is ensured that the series $\pi_j^{-1}(n)$ can be simply generated for successive values of n.

This also applies when one uses as $\sigma_j$ alternately a pseudo-random permutation (in which the coefficient $f_i$ for the highest power in $\alpha$ is non-zero) and the identity permutation ($\sigma(n)=0,1,\ldots m-1$). (For the resulting permutations $\pi_j$ to be pseudo random it is necessary that at least every second permutation $\sigma_j$ is pseudo random; not all $\sigma_j$ need to be random). For properly chosen $f_i$ this results in interleaving with a substantially uniform distribution of differences between successive addresses for every block. The use of only two different permutations makes interleaving simple.

When the permutations $\pi_j(n)$, $\pi_{j+1}(n)$ are chosen from different sets $\Lambda_\alpha$ and $\Lambda_{\alpha'}$, there will be obtained an overall set $\Lambda_{\alpha''}$ in which $\alpha''$ constitutes the largest common denominator of $\alpha$ and $\alpha'$; the potency of $\alpha''$, could then be higher than that of $\Lambda_\alpha$ and $\Lambda_{\alpha'}$. The necessary sequences of writing and reading $\sigma_j$ then belong to $\Lambda_{\alpha''}$ and hence can be simply generated.

The numbers $f_1^{(j)}$ describing the sequences $\sigma_j$ can be calculated by utilizing the above explicit expression for compositions of permutations. However, it has been found that in a number of cases these numbers can be recursively calculated. If the potency s of a is two, for example the following holds:

$$f_0^{(t+1)} = f_0^{(t)} + c f_1^{(t)} + [c(c-1)/2] \alpha f_2^{(t)}$$

$$f_1^{(t+1)} = b f_1^{(t)} + (b c + b(b-1)/2) \alpha f_2^{(t)}$$

$$\alpha f_2^{(t+1)} = \alpha e f_1^{(t)} + (b b + \alpha(\alpha-1)/2) \alpha f_2^{(t)}$$

where $f_0^{(0)} = c$, $f_1^{(0)} = b$ and $f_2^{(0)} = e$. (All these expressions are modulo m). The invention can be applied in the circuit arrangement of FIGS. 1 and 2. This circuit arrangement comprises a permutation unit for receiving a series of blocks of data items and for outputting these blocks, the data items in each block being output in permuted form. Here, the permutation unit includes a) a memory,
b) a write/read unit for writing and reading the data items into and from the memory, and
c) an address generator for generating address sequences of respective addresses of locations in which the data items are written into and read from the memory, The permutation unit reads the data items from each block with a respective address sequence from a set of locations of the memory, and writes the data items from each block, with the exception of an initial block, in the set in the address sequence in which the data items of a directly preceding block have been read. In this circuit arrangement the address generator is arranged to generate for each block a respective address sequence in which the $n^{th}$ address for each n corresponds to a permutation $\sigma(n)$ of the numbers 0 ... m−1 in conformity with $$\sigma(n) = f_0 + \sum_{i=1}^{s} f_i \binom{n}{i} \alpha^{i-1} \bmod m$$

in which m is the number of data items in the block, $\alpha$ is an integer number which is divisible by all prime factors of m, with a potency $s(\alpha)$ of two or higher, and in which $f_i$ i=0 . . . s, are natural numbers which always change from one block to another. Preferably, $\alpha$ is a multiple of four if m is a multiple of four. Also preferably, the address generator comprises a recursion unit for generating the address sequence and initialization means for initializing the recursion unit prior to the generating of the address sequence for a block. To get simple permutations the potency $s(\alpha)$ is preferably two. n which all $f_i$ are equal, with the exception of $f_0$, and have a largest common denominator of 1 with m. In one application of the circuit arrangement the operation of the permutation unit results in a respective permutation for each block, which permutation relates the address sequence upon writing to the address sequence upon reading of the relevant block, and in which the $f_i$ i=0 . . . s are chosen so that the respective permutations are identical for all blocks.

It will be evident that the invention derives from the group character of the set $\Lambda_\alpha$. When a block of data items is to be permuted each time according to permutations from this set, such an operation can be carried out by writing each time a block of data items into a memory in an address sequence in conformity with a permutation from this set, and by subsequently reading these data items from the memory in conformity with a different permutation from this set. These permutations will have pseudo random properties if the potency of $\alpha$ is at least two, and when the coefficient $f_i$ of the highest non-zero power of $\alpha$ is non-zero. The complexity of the address generation then always remains the same. The address generator can be realised, for example by means of a recursive circuit. The simplest method of generating pseudo-random permutations in this manner is to use an $\alpha$ of potency two, because the least number of calculations are then required to generate the permutations. The use of $\alpha$ values of higher potency, for example 3, however, may be more attractive because better random properties can thus be more readily realised. This is a matter of selection: sequences of the generated address are tested so as to find out whether they have the random properties required for the relevant application.

It will be clear that the invention is not limited to the transmission system shown by way of example, or to address generators more generally. The invention applies to any field of use where several pseudo-random permutations of numbers have to be generated that are different compositions of basic pseudo-random permutations. The invention can be used to generate these several permutations all with the same basic generator, such as the one shown in FIG. 3, by initializing the registers 23, 27 and the memory 28 to the values specifying each specific permutation. Of course this could also be achieved by a suitably programmed computer, in which the same program code is used to generate different permutations, as specified by the set of coefficients $f_i$.

Nor is the invention limited to data-items stored in memory. The method of permuting can be applied to batches of any physical kind of item, by storing the items of the batch in a storage medium and ordering the processing of the items in the batch according to their location in the storage medium. One uses different permutations from one group $\Lambda_\alpha$, for storing and retrieving respectively. This makes it possible to save space in this storage medium without requiring increasingly complex permutations, when one stores items from a new batch before a previous batch has been fully retrieved from the storage medium. The items in the batches can be data-items, which are processed by transmitting them, but they can for example also be manufacturing products, which are processed during manufacturing. The foregoing merely illustrates the principles of the invention. It will thus be appreciated that those skilled in the art will be able to devise various arrangements which, although not explicitly described or shown herein, embody the principles of the invention and are thus within its spirit and scope.

We claim:

1. A circuit arrangement which generates successive pseudo random permutations of a set of "m" numbers, comprising:
   control means for generating control signals, each control signal specifying a respective set of "s+1" integer coefficients "$f_i$", i=0 . . . s, "s" being a natural number greater than one; and
   computing means operating in repeated cycles, each cycle under control of a respective one of the control signals, for computing in that cycle a respective one of the successive permutations corresponding to $$\sigma(n) = f_0 + \sum_{i=1}^{s} f_i \binom{n}{i} \alpha^{i-1} \bmod m$$

in which the $f_i$ are the integer coefficients from the set specified by the respective one of the control signals, and $\alpha$ is an integer number common to all cycles, $\alpha$ being divisible by all prime factors of m, $\alpha$ having a potency $s(\alpha)$ equal to "s" with respect to m.

2. A circuit arrangement as claimed in claim 1, wherein at least one of the control signals specifies a set of s+1 integer coefficients such that a resulting permutation corresponds to a composition of at least two permutations from among the successive permutations.

3. A circuit arrangement as claimed in claim 1, wherein $\alpha$ is a multiple of four if m is a multiple of four.

4. A circuit arrangement as claimed in claim 1, wherein the potency s is two.

5. A circuit arrangement as claimed in claim 1, in which in at least one of the respective sets of integer coefficients all $f_i$, with the exception of $f_0$, are equal to each other, and have a largest common denominator of 1 with m.

6. A circuit arrangement as claimed in claim 1, wherein the calculating means are arranged for computing successive permuted numbers in each cycle in successive steps n=0 . . . m−1, from intermediate variables $u^{(i)}$ i=0 . . . s, intermediate variable $u^{(0)}$ being initialized to $f_0$ initial one of the steps at a beginning of each cycle, intermediate variables $u^{(i)}$ i=1 . . . p−1 being initialized to $ku^{(i)} = f_i \alpha^{i-1}$ in the initial one of the steps, a value of each of the intermediate variables $u^{(i)}$ except $u^{(s)}$ being replaced, in each successive step but the initial one of the steps, by a respective modulo sum ($u^{(i)}$+ $u^{(i+1)}$ mod m) of the intermediate variables in the preceding step, the value of the intermediate variable $u^{(0)}$ in the successive steps n=0 . . . m−1 being used as the permuted numbers $\sigma(n)$.

7. A circuit arrangement as claimed in claim 6, comprising a cascade of s recursion units, each comprising a respective memory element and a respective modulo adder, the respective modulo adder of a front end recursion unit in the cascade having a first summand input coupled to the respective memory element of the front end recursion unit and to a further memory element, the respective modulo adder of each particular recursion unit, except the front end recursion unit, having a first summand input coupled to the memory element of the particular recursion unit and a second summand input coupled to the memory element of the recursion unit that precedes the particular recursion unit in the cascade, a sum output of the respective modulo adder in each recursion unit being coupled to an input of the respective memory element of that recursion unit, the calculating means being arranged for initializing a content of the memory element in a final recursion unit in the cascade at the beginning of each cycle to $f_0$ and a content of the memory element in the recursion units that successively precede the final recursion unit in the cascade to $f_i\alpha^{i-1}$ i=1 ... s−1 respectively, the further memory element being initialized to $f_s\alpha^{s-1}$, the respective memory elements of each recursion units loading an output of the respective modulo adder in each of successive steps n=1 ... m, the contents of the memory element of the final recursion unit being supplied as an output as the random number σ(n) in each of the successive steps.

8. A circuit arrangement as claimed in claim 1, further comprising:
   a memory, the numbers from the set of "m" numbers corresponding to addresses referring to respective locations in the memory;
   a read/write unit, for writing a respective set of data items into the memory in each particular cycle, and reading that respective set of data items from the memory in a subsequent one of the cycles succeeding the particular cycle, each respective set of data items being written in an order of addresses corresponding to the permutation generated for its particular cycle and read in an order of addresses corresponding to the permutation generated for the subsequent cycle.

9. A circuit arrangement as claimed in claim 8, wherein the sets of integer coefficients $f_i$ are selected such that a composition of an inverse of the permutation calculated for the particular cycle with the permutation calculated for the subsequent cycle is equal to a common permutation independent of the particular cycle.

10. A circuit arrangement as claimed in claim 8, comprising an encoder, the encoder generating the set of data items in an error protecting code.

11. A circuit arrangement as claimed in claim 8, comprising an error corrector, the error corrector correcting the set of data items according an error protecting code applied to the data items in the order in which they are read.

12. A method of processing a batch of m items, the method comprising the steps of:
   receiving the batch, each item in the batch being received in association with a first own rank number in the batch;
   assigning a respective location in a storage medium to each particular item, according to a first function of the first own rank number of the particular item;
   storing each particular item in the storage medium at the respective location assigned to it;
   assigning a second own rank number to each storage location, according to a second function of the storage location;
   retrieving the items from the storage medium; and
   processing the particular item retrieved from a particular storage location according to the second own rank number of that particular location, wherein the first function and the second function are computed in correspondence with $$\text{location}(n1) = f_0 + \sum_{i=1}^{s} f_i \binom{n1}{i} \alpha^{i-1} \bmod m$$

$$\text{ranknumber}(n2) = g_0 + \sum_{i=1}^{s} g_i \binom{n2}{i} \alpha^{i-1} \bmod m$$

respectively, n1 being the rank number, n2 being a location number of the storage location in an order of storage locations, the $f_i$ and $g_i$ i=0 ... s being integer coefficients from respective sets, each of s+1 integers, and α being an integer number, divisible by all prime factors of m, α having a potency equal to "s" with respect to m.

13. A method as claimed in claim 12, wherein α is a multiple of four if m is a multiple of four.

14. A method as claimed in claim 12, wherein the potency s(α) is two.

15. A method as claimed in claim 12, wherein all $f_i$, with the exception of $f_0$, are equal to each other, and have a largest common denominator of 1 with m.

16. A method as claimed in claim 12, wherein successive permuted numbers σ(n) in each cycle are computed in successive steps n=0 ... m−1, from intermediate variables $u^{(i)}$ i=0 ... s, intermediate variable $u^{(0)}$ being initialized to $f_0$ in an initial one of the steps at a beginning of each cycle, intermediate variables $u^{(i)}$ i=1 ... p−1 being initialized to $u^{(i)} = f_i\alpha^{i-1}$ in the initial one of the steps, a value of each of the intermediate variables $u^{(i)}$ except $u^{(s)}$ being replaced, in each successive step but the initial one of the steps, by a respective modulo sum ($u^{(i)} + u^{(i+1)}$ mod m) of the intermediate variables in the preceding step, the value of the intermediate variable $u^{(0)}$ in the successive steps n=0 ... m−1 being used as the permuted numbers σ(n).

* * * * *